(12) United States Patent
Yoshida

(10) Patent No.: US 7,329,908 B2
(45) Date of Patent: Feb. 12, 2008

(54) NITRIDE-BASED COMPOUND SEMICONDUCTOR ELECTRON DEVICE INCLUDING A BUFFER LAYER STRUCTURE

(75) Inventor: Seikoh Yoshida, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/812,947

(22) Filed: Mar. 31, 2004

(65) Prior Publication Data
US 2005/0051804 A1 Mar. 10, 2005

(30) Foreign Application Priority Data
Sep. 5, 2003 (JP) .............................. 2003-313765

(51) Int. Cl.
*H01L 31/072* (2006.01)
*H01L 31/109* (2006.01)
*H01L 31/0328* (2006.01)
*H01L 31/0336* (2006.01)

(52) U.S. Cl. ...................................... 257/192; 257/213
(58) Field of Classification Search ............ 257/76–78, 257/213–413, 900, 902, 903, 192
See application file for complete search history.

(56) References Cited

FOREIGN PATENT DOCUMENTS

| JP | 2002-198483 | * | 10/2001 |
| JP | 2001-326232 | * | 11/2001 |
| JP | 2002-50758 | * | 2/2002 |
| JP | 2003-059948 | * | 2/2003 |

OTHER PUBLICATIONS

Tang et al., Reproducibility of growing AlGaN/GaN high-electron-mobility-transistor heterostructures by molecular-beam epitaxy, Solid-State Electronics, 2000, pp. 2177-2182.*

Tang et al., Growth of high-performance GaN modulation-doped field-effect transistors by ammonia-molecular-beam epitaxy, Journal of Vacuum Science & Technology, 2000, pp. 652-655.*

Corlatan et al., Photoluminescence characterization of p-type GaN:Mg, Materials Research Society, 1998, pp. 673-678.*

* cited by examiner

*Primary Examiner*—Monica Lewis
(74) *Attorney, Agent, or Firm*—Oblon, Spivak, McClelland, Maier & Neustadt, P.C.

(57) ABSTRACT

A GaN-based FET has a buffer layer structure including GaN first buffer layer and an AlGaN second buffer layer between a substrate and an active layer structure including a channel layer and a donor layer. The GaN first buffer layer and the AlGaN second buffer layer reduce dislocation defects in the active layer structure and allows the FET to have a lower leakage current and a satisfactory pinch-off characteristic. A plurality of GaN first buffer layers and a plurality of AlGaN second buffer layers may be deposited alternately one on another on the substrate.

9 Claims, 1 Drawing Sheet

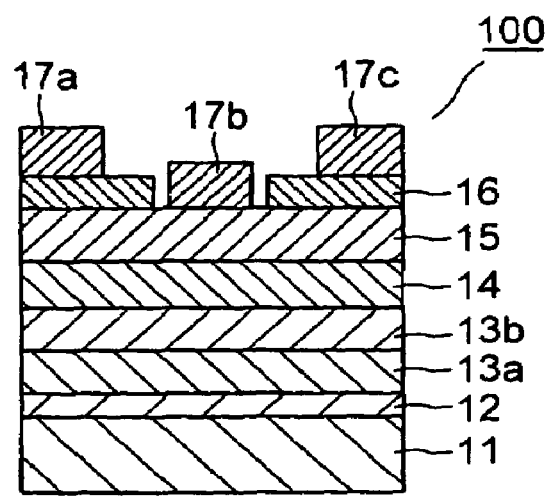
FIG. 1
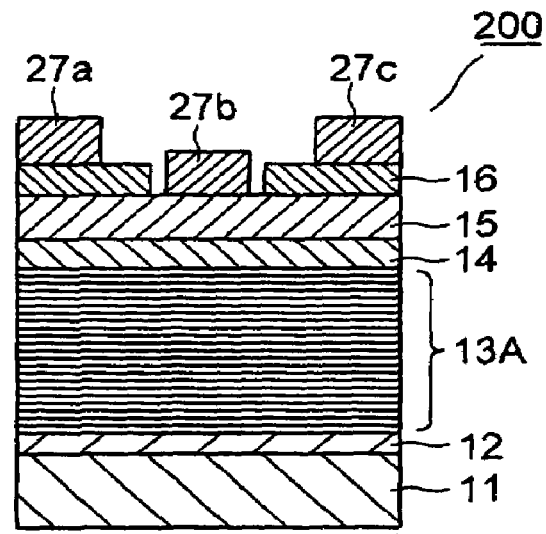
FIG. 2
RELATED ART
FIG. 3
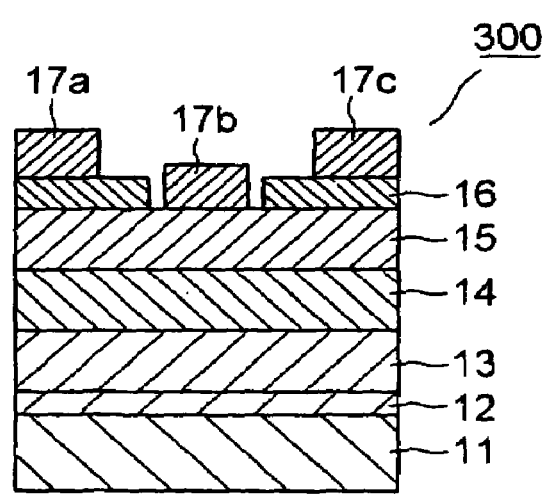

NITRIDE-BASED COMPOUND SEMICONDUCTOR ELECTRON DEVICE INCLUDING A BUFFER LAYER STRUCTURE

BACKGROUND OF THE INVENTION

1. Field of the Invention

The present invention relates to a nitride-based compound semiconductor electron device, and more particularly, to a semiconductor electron device, such as a field-effect transistor, including nitride-based compound semiconductors as min component thereof.

2. Description of the Related Art

In general, field-effect transistors (FETs) having nitride-based compound semiconductors, such as GaN-based compound semiconductors, are substantially free from a burn-up failure even at an operating temperature as high as close to 400° C., and thus are drawing attention as solid laser devices operating at a higher temperature range. Hereinafter, the FETs having GaN-based compound semiconductors are referred to as GaN-based FETs.

However, it is difficult to manufacture a single-crystal substrate having a large diameter in the case of a GaN-based crystal differently from the cases of Si crystal, GaAs crystal, and InP crystal. Thus, it is difficult to form a semiconductor layer structure in a GaN-based FET by epitaxially growing a crystalline layer of a GaN-based material on a GaN single-crystal substrate. Accordingly, in manufacturing a GaN-based FET, a crystalline layer of GaN-based semiconductor is grown by using the process such as described hereinafter. It is to be noted that the process will be described taking as an example a lateral GaN-based FET shown in the schematic drawing of FIG. 3.

First, on a single-crystal sapphire substrate 11 for the crystal growth, an intermediate layer 12 including a GaN single crystal as a main component thereof is deposited by using an epitaxial crystal growth process, such as a MOCVD process, while appropriately selecting the filming conditions for the crystal growth, such as selecting a growth temperature at 500 to 600° C., for example.

Thereafter, a buffer layer 13, a channel layer 14, a donor layer 15, and a contact layer 16 are consecutively deposited on the intermediate layer 12 by using a GaN epitaxial growth process. Thereafter, an electrode group is formed on the semiconductor layer structure, the electrode group including a source electrode 17a and a drain electrode 17c, which are coupled to the semiconductor layer structure with an ohmic contact, and a gate electrode 17b, which is coupled thereto with a Schottky contact or MIS (Metal-Insulator-Semiconductor) structure, to thereby achieve the lateral GaN-based FET as shown in FIG. 3.

In the conventional structure of the GaN-based FETs, as described above, the lattice constants are significantly different between the sapphire substrate 11 and the GaN single crystal, and hence, the intermediate layer 12 generally has therein dislocation defects caused by the lattice mismatch with the sapphire substrate 11 and extending perpendicular to the depthwise direction of the film. The dislocation density in the semiconductor layer structure usually has a value of about $1 \times 10^9$ to $1 \times 10^{10}$ cm$^{-2}$. Thus, in the GaN-based FET, the semiconductor layer structure including the channel layer 14, the donor layer 15, and the contact layer 16 is formed on the intermediate layer 12 having such defects.

More specifically, in the FET having the above-described layer structure, dislocation defects existing in the intermediate layer 12 are transmitted directly in the depthwise direction (or vertical direction) into the semiconductor active layer structure of GaN crystal having the FET function. The number of existing dislocation defects is, for example, about 100 per unit area of 1 μm$^2$ of the semiconductor layer structure. Hence, the GaN crystal structure configuring the semiconductor active layer structure is degraded in the film quality thereof. This causes a problem of leakage current in the resultant GaN-based FETs to degrade the pinch-off characteristic.

More generally, there has been the problem, in a semiconductor electron device having nitride-based compound semiconductors, that leakage current flows due to dislocation defects in the layer structure other than the channel layer, resulting in that a satisfactory pinch-off characteristic cannot be obtained.

Accordingly, various techniques have been examined for suppressing the dislocation defects, i.e., one of the factors that cause occurrence of the leakage current. Japanese Patent Laid-Open Publication No. 2003-059948, for example, describes a method that suppresses dislocation defects by providing a buffer layer structure wherein AlN layers and GaN layers are alternately deposited one on another on a silicon substrate. However, even with this method, the leakage current cannot be reduced to a satisfactory degree, and thus a satisfactory pinch-off characteristic cannot be obtained heretofore.

SUMMARY OF THE INVENTION

In view of the above, it is an object of the present invention to solve the above problem and provide a semiconductor electron device including nitride-based compound semiconductors and having an excellent pinch-off characteristic.

The present invention provides a nitride-based compound semiconductor electron device including: a substrate; and a semiconductor layer structure including a buffer layer structure, a channel layer and a donor layer, that are consecutively formed in this order on the substrate, wherein the buffer layer structure includes: at least one first buffer layer comprising as a main component thereof a compound semiconductor expressed by the general formula of $Al_x In_y Ga_{1-x-y} As_u P_v N_{1-u-v}$ (where $0 \leq x \leq 1$, $0 \leq y \leq 1$, $x+y \leq 1$, $0 \leq u \leq 1$, $0 \leq v < 1$, and $u+v < 1$); and at least one second buffer layer comprising as a main component thereof a compound semiconductor expressed by the general formula of $Al_a In_b Ga_{1-a-b} As_c P_d N_{1-c-d}$ (where $0 \leq a \leq 1$, $0 \leq b \leq 1$, $a+b \leq 1$, $0 \leq c < 1$, $0 \leq d < 1$, and $c+d < 1$), and wherein the first buffer layer and the second buffer layer have different bandgap energies, and have two-dimensional electron gas density or densities therein not greater than $5 \times 10^{12}$ cm$^{-2}$.

In accordance with the semiconductor electron device of the present invention, the buffer layer structure, including two different layers which are different in the quality of material, suppresses the leakage current caused by the two-dimensional electron gas, that is accumulated in one of the layers having a smaller bandgap energy and being disposed adjacent to the interface between the two different layers. The suppression of the leakage current can provide a semiconductor electron device including the nitride-based compound semiconductor with an excellent pinch-off characteristic. In particular, the advantage is more remarkable if a larger current of greater than 1 ampere is output or a high power source voltage of greater than 100 volts is applied in the semiconductor electron device, whereby it has an excellent pinch-off characteristic and a high withstand voltage.

Further, the semiconductor electron device of the present invention may have an intermediate layer between the substrate and the buffer layer structure, and a contact layer between the donor layer and the electrodes for reducing the contact resistance therebetween. Moreover, a substrate made of a material such as sapphire, SiC, Si, GaAs, or GaP may be preferably used as the substrate for crystal growth.

The above and other objects, features and advantages of the present invention will be more apparent from the following description, referring to the accompanying drawings.

BRIEF DESCRIPTION OF THE DRAWINGS

FIG. 1 is a cross-sectional view exemplifying the layer structure of a semiconductor electron device according to a first embodiment of the present invention.

FIG. 2 is a cross-sectional view exemplifying the layer structure of a semiconductor electron device according to a second embodiment of the present invention.

FIG. 3 is a cross-sectional view of the layer structure of a conventional semiconductor electron device.

DETAILED DESCRIPTION OF THE PREFERRED EMBODIMENTS

Now, the present invention will be described below in more detail by way of preferred embodiments thereof with reference to the accompanying drawings, wherein similar constituent elements are designated by similar reference numerals throughout the drawings.

Referring to FIG. 1, a semiconductor electron device, generally designated by numeral 100, according to a first embodiment of the present invention includes: a silicon substrate (semiconductor substrate) 11; a layer structure including a GaN intermediate layer 12, a pair of buffer layers including a first buffer layer 13a and a second buffer layer 13b, an GaN channel layer 14, an AlGaN donor layer 15, and a GaN contact layer, which are consecutively deposited on the silicon substrate 11; and an electrode group including an Al/Ti/Au source electrode 17a formed on the contact layer 16, a Pt/Au gate electrode 17b formed on the donor layer 15, and an Al/Ti/Au drain electrode 17c formed on the contact layer 16.

In the above structure, the first buffer layer 13a is made of GaN, and the second buffer layer 13b is made of AlGaN. The AlGaN second buffer layer 13b has a bandgap energy larger than the bandgap energy of the GaN first buffer layer 13a. The contact layer 16 formed on the donor layer 15 has a recess in which the Pt/Al gate electrode 17b directly contacts with the donor layer 15, whereas the Al/Ti/Au source and drain electrodes 17a and 17c are coupled to the donor layer 15 with an intervention of the contact layer 16. The contact layer 16 is provided for reducing the resistance of the ohmic contact between the source and drain electrodes and the donor layer 15.

A process used for manufacturing a sample of the semiconductor electron device shown in FIG. 1 will be described hereinafter.

A MOCVD apparatus was used as a growth apparatus, and a silicon substrate chemically etched with hydrofluoric acid was used as the silicon substrate 11.

The silicon substrate 11 was introduced into the chamber of the MOCVD apparatus, and the chamber was evacuated with a turbo pump until the degree of vacuum therein became $1\times10^{-6}$ hPa or less, followed by heating the substrate 11 up to a temperature of 800° C. at a vacuum degree of 100 hPa. After the substrate temperature became stable, trimethyl gallium (TMG) and $NH_3$ were introduced as source materials onto the surface of the silicon substrate 11 at flow rates of 58 μmol/min. and 12 l/min., respectively, with the silicon substrate 11 being rotated at 900 rpm, to thereby grow thereon the GaN intermediate layer 12. The growth time was 4 minutes and the film thickness of the intermediate layer 12 was about 50 nm.

Subsequently, the substrate temperature was raised up to 1030° C., followed by introducing trimethyl gallium (TMG), $NH_3$, and bis-cyclopentadienyl magnesium ($CP_2Mg$) onto the intermediate layer 12, at flow rates of 58 μmol/min., 12 l/min., and 0.01 μmol/min., respectively, to grow the GaN first buffer layer 13a. The growth time was 100 seconds and the film thickness of the GaN first buffer layer 3a was 50 nm. It is to be noted that Mg was added therein in an amount of $1\times10^{18}$ $cm^{-3}$.

Thereafter, trimethyl gallium (TMG), trimethyl aluminum (TMA), $NH_3$, and bis-cyclopentadienyl magnesium ($CP_2Mg$) were introduced onto the GaN first buffer layer 13a, at flow rates of 29 μmol/min., 29 μmol/min., 12 l/min, and 0.01 μmol/min., respectively, to grow the $Al_{0.5}Ga_{0.5}N$ second buffer layer 13b. The growth time was 40 seconds and the film thickness of the $Al_{0.5}Ga_{0.5}N$ second buffer layer 3b was 20 nm. It is to be noted Mg was added therein in an amount of $1\times10^{18}$ $cm^{-3}$.

By inserting the two buffer layers 13a and 13b having different compositions between the silicon substrate 11 and the intermediate layer 12, as described above, the dislocation was deflected in the transmission direction thereof from the depthwise direction or growth direction, to thereby reduce the dislocation defects in the active layer structure overlying the buffer layers 13a and 13b.

In this manner, the amount of dislocation defects was suppressed down to about $1\times10^8$ $cm^{-2}$, whereby an AlGaN/GaN heterostructure having reduced dislocation defects was obtained.

Subsequently, trimethyl gallium (TMG) and $NH_3$ were introduced onto the buffer layer 13 at flow rates of 58 μmol/min. and 12 l/min., respectively, to thereby grow the GaN channel layer 14. The growth time was 1000 seconds and the film thickness of the channel layer 14 was 500 nm.

Thereafer, trimethyl gallium (TMG), trimethyl aluminum (TMA), and $NH_3$ were introduced at flow rates of 41 μmol/min., 17 μmol/min., and 12 l/min. respectively, to thereby grow the AlGaN donor layer 15. The growth time was 40 seconds and the film thickness of the donor layer 15 was 20 nm.

Further, trimethyl gallium (TMG), $SiH_4$, and $NH_3$ were introduced at flow rates of 58 μmol/min., 0.01 μmol/min., and 12 l/min., respectively, to thereby grow the GaN contact layer 16 on the donor layer 15. The growth time of the contact layer 16 was 40 seconds and the film thickness of the contact layer 16 was 20 nm. Subsequently, the contact layer 16 was subjected to etching to form the recess therein, followed by depositing the source electrode 17a, the gate electrode 17b, and the drain electrode 17c on the contact layer 16 and the donor layer 16, by an evaporation technique.

While applying a voltage between the source electrode 17a and the drain electrode 17c and a reverse voltage to the gate electrode 17b in the resultant GaN-based FET, the pinch-off characteristic of the FET was examined. It was found that the pinch-off of the FET occurred when the voltage applied to the gate electrode 17b was −3 volts. The withstand voltage between the source electrode 17a and the drain electrode 17c during an off-state of the FET was 523 volts.

Next, a test sample was fabricated for measuring the leakage current of the FET. The contact layer 16, the donor layer 15, and the channel layer 14 were removed by etching, and two ohmic electrodes were formed on the buffer layer 13. While applying a voltage between the source electrode 17a and the drain electrode 17c, leakage current was measured, which exhibited 0.1 μA. This value is about 1/1000 of the leakage current of 100 μA of typical semiconductor electron devices manufactured by using a conventional technique.

Referring to FIG. 2, a semiconductor electron device, generally designated by numeral 200, according to a second embodiment of the present invention has a buffer layer structure 13A including 30 GaN first buffer layers and 30 AlGaN second buffer layers which are alternately deposited one on another on the intermediate layer 12.

More specifically, the semiconductor electron device 200 includes the silicon substrate 11, the intermediate layer 12, the channel layer 14, the donor layer 15, and the contact layer 16, which are deposited and configured similarly to those of the first embodiment with the exception of the buffer layer structure 13A.

In the buffer layer structure 13A, the GaN first buffer layers are designated herein by numerals $13a_n$ ($13a_1$, $13a_2$ ... $13a_{30}$), as viewed consecutively from the bottom, whereas AlGaN second buffer layers are designed herein by numerals $13b_n$ ($13b_1$, $13b_2$ ... $13b_{30}$), as viewed consecutively from the bottom. It is to be noted that the AlGaN second buffer layers $3b_n$ have a bandgap energy larger than the bandgap energy of the GaN first buffer layers $13a_n$.

In the second embodiment, the source electrode 27a and the drain electrode 27c are made of Ta silicide which is in contact with the contact layer 16, whereas the gate electrode 17b is made of Pt/Au which is in direct contact with the donor layer 15.

The GaN first buffer layers $13a_1$, $13a_2$ ... $13a_{30}$ need not have the same bandgap energy, so long as the bandgap energy of each of the GaN first buffer layers $13a_1$, $13a_2$ ... $13a_{30}$ is smaller than the bandgap energy of each of the AlGaN second buffer layers $13b_1$, $13b_2$ ... $13b_{30}$.

Likewise, the AlGaN second buffer layers $13b_1$, $13b_2$ ... $13b_{30}$ need not have the same bandgap energy, so long as the bandgap energy of each of the AlGaN second buffer layers $13b_1$, $13b_2$ ... $13b_{30}$ is larger than the bandgap energy of each of the GaN first buffer layers $13a_1$, $13a_2$ ... $13a_{30}$.

A process used for manufacturing a sample of the semiconductor electron device of the second embodiment will be described hereinafter by specifically reciting the differences between the present embodiment and the first embodiment.

After depositing the intermediate layer 12, the substrate temperature was raised up to 1030° C. Trimethyl gallium (TMG), $NH_3$, and bis-cyclopentadienyl magnesium ($CP_2Mg$) were introduced onto the intermediate layer 12 at flow rates of 58 μmol/min., 12 l/min., and 0.01 μmol/min., respectively, to thereby grow the GaN first buffer layer $13a_1$. The growth time was 20 seconds and the film thickness of the GaN layer $13a_1$ was 10 nm. It is to be noted that Mg was added therein in an amount of $1\times10^{18}$ cm$^{-3}$.

Subsequently, trimethyl gallium (TMG), trimethyl aluminum (TMA), $NH_3$, and bis-cyclopentadienyl magnesium ($CP_2Mg$) were introduced at flow rates of 29 μmol/min., 29 μmol/min., 12 l/min., and 0.01 μmol/min., respectively, to thereby grow the $Al_{0.5}Ga_{0.5}N$ second buffer layer $13b_1$. The growth time was 20 seconds and the film thickness of the $Al_{0.5}Ga_{0.5}N$ second buffer layer $13b_1$ was 10 nm. Mg was added therein in an amount of $1\times10^{18}$ cm$^{-3}$.

The GaN first buffer layers $13a_n$ and the $Al_{0.5}Ga_{0.5}N$ second buffer layers $13b_n$ were alternately grown one on another in the order of $13a_1$, $13b_1$, $13a_2$, $13b_2$ .... $13a_{30}$, $13b_{30}$, to thereby form 30 layers each.

The processes used for fabricating the channel layer 14, the donor layer 15, the contact layer 16, and the electrodes 17a, 17b, 17c on the second buffer layer $3b_{30}$ are similar to the those in the first embodiment.

The pinch-off characteristic was evaluated in the second embodiment as in the first embodiment. The pinch-off occurred in the FET when the voltage applied to the gate electrode 17b was −3 volt. The withstand voltage between the source electrode 17a and the drain electrode 17c during the off-state was 648 volts.

In addition, the leakage current of the FET decreased down to about 5 nA. This value is about 1/20 of the leakage current of the semiconductor electron device 100 manufactured in the first embodiment.

It is generally desired that the buffer layer 13 be electrically neutral in order to reduce the leakage current of the FET. However, residual impurities in the GaN-based compound semiconductor generally exist in an amount of about $1\times10^{16}$ cm$^{-3}$ and at least in an amount of about $5\times10^{15}$ cm$^{-3}$, thereby causing the buffer layer 13 to assume the n-type conductivity.

The concentration of p-type impurities to be added in order to compensate for the n-type carriers of the buffer layer structure amounts to at least about $1\times10^{16}$ cm$^{-3}$. However, since the activation rate of the p-type impurities is relatively low compared to the n-type impurities, the p-type impurities need to be added in an amount of about $1\times10^{18}$ cm$^{-3}$. Hence, in the present embodiment, Mg was added as p-type impurities in an amount of $1\times10^{18}$ cm$^{-3}$. It is to be noted that if the amount of p-type impurities to be added for the compensation exceeds $1\times10^{21}$ cm$^{-3}$, the buffer layer 13 may assume the p-type conductivity, which is undesirable. Thus, the amount of p-type impurities should be preferably $1\times10^{21}$ cm$^{-3}$ or less.

Next, a semiconductor electron device according to a third embodiment of the present invention will be described. The third embodiment is similar to the first embodiment in the basic structure thereof, and is different from the first embodiment in that the first and second buffer layers have different thicknesses by using different growth times for the first and second buffer layers.

Table 1 shows the leakage current measured in the third embodiment while changing the film thicknesses, and the two-dimensional electron gas density measured in a CV (capacitance-voltage) measurement, similarly to the measurements in the first embodiment.

TABLE 1

| Thickness (nm) | First Buffer Layer | 0.2 | 0.5 | 1.0 | 5.0 | 10 | 20 | 25 | 30 |
|---|---|---|---|---|---|---|---|---|---|
|  | Second Buffer Layer | 0.2 | 0.5 | 1.0 | 5.0 | 10 | 20 | 25 | 30 |
| Leakage Current (μA) | | 132 | 10.0 | 0.1 | 0.1 | 0.1 | 1.0 | 54 | 97 |
| Two-Dimensional Electron Gas Density ($10^{12}$ cm$^{-2}$) | | 0.1 | 1.0 | 1.0 | 2.0 | 4.0 | 5.0 | 12 | 23 |

Next, a fourth embodiment of the present invention will be described. The fourth embodiment is similar to the first embodiment in the basic structure thereof, and is different therefrom in that the Al composition of the second buffer layer is changed by changing the amount of trimethyl aluminum (TMA) introduced during the growth of the second buffer layer.

Table 2 shows the leakage current measured in the fourth embodiment while changing the film thicknesses, similarly to the measurements in the first embodiment.

TABLE 2

| Al Composition of Second Buffer Layer | 0.1 | 0.3 | 0.5 | 0.7 | 0.9 |
|---|---|---|---|---|---|
| Leakage Current (μA) | 10 | 5.0 | 0.1 | 0.5 | 5.0 |

It is to be noted that the present invention is not limited to the above embodiments. For example, although the thicknesses of the first and second buffer layers are equal in the above embodiments, the thicknesses of the first and second buffer layers may be different. In addition, although the first buffer layer and the second buffer layer are made of GaN and AlGaN, respectively, in the above embodiments, the first buffer layer and the second buffer layer may be made of InGaN and AlGaN, respectively, or may be made of InGaN and GaN, respectively. Furthermore, although the gate electrode is made of Pt/Au in the above embodiments, the gate electrode may be made of Pd, W, Ni etc. alone or in combination thereof.

By using the present invention, the leakage current of semiconductor electron devices can be suppressed, and the withstand voltage thereof can be improved. In particular, it is possible to manufacture semiconductor electron devices that operate with a higher withstand voltage and a lower ON-resistance and are excellent in the pinch-off characteristic thereof.

What is claimed is:

1. A nitride-based compound semiconductor electron device comprising:
    a substrate; and
    a semiconductor layer structure including a buffer layer structure, a channel layer and a donor layer, that are consecutively formed in this order on said substrate, wherein:
    said buffer layer structure includes: at least one first buffer layer comprising as a main component thereof a compound semiconductor expressed by the general formula of $Al_xIn_yGa_{1-x-y}As_uP_vN_{1-u-v}$ (where $0 \leq x \leq 1$, $0 \leq y \leq 1$, $x+y \leq 1$, $0 \leq u < 1$, $0 \leq v < 1$, and $u+v < 1$); and at least one second buffer layer comprising as a main component thereof a compound semiconductor expressed by the general formula of $Al_aIn_bGa_{1-a-b}As_cP_dN_{1-c-d}$ (where $0 \leq a \leq 1$, $0 \leq b \leq 1$, $a+b \leq 1$, $0 \leq c < 1$, $0 \leq d < 1$, and $c+d < 1$), wherein said first buffer layer and said second buffer layer have different bandgap energies, and have two-dimensional electron gas density or densities therein not greater than $5 \times 10^{12}$ cm$^{-2}$; and
    said first and second buffer layers comprising one of Mg, Be, Zn, and C in an amount of not less than $1 \times 10^{16}$ cm$^{-3}$ and not greater than $1 \times 10^{21}$ cm$^{-3}$; and
    said first buffer layer having a thickness of not less than 0.5 nm and not greater than 20 nm, and said second buffer layer has a thickness of not less than 0.5 nm and not greater than 20 nm.

2. The semiconductor electron device according to claim 1, wherein said first buffer layer has an Al composition of x not less than 0.5.

3. The semiconductor electron device according to claim 1, wherein said buffer layer structure includes a plurality of first buffer layers and a plurality of said second buffer layers, which are alternatively laid one on another.

4. A nitride-based compound semiconductor electron device comprising:
    a substrate; and
    a semiconductor layer structure including a buffer layer structure, a channel layer and a donor layer, that are consecutively formed in this order on said substrate, wherein:
    said buffer layer structure includes: at least one first buffer layer comprising as a main component thereof a compound semiconductor expressed by the general formula of $Al_xIn_yGa_{1-x-y}As_uP_vN_{1-u-v}$ (where $0 \leq x \leq 1$, $0 \leq y \leq 1$, $x+y \leq 1$, $0 \leq u < 1$, $0 \leq v < 1$, and $u+v < 1$); and at least one second buffer layer comprising as a main component thereof a compound semiconductor expressed by the general formula of $Al_aIn_bGa_{1-a-b}As_cP_dN_{1-c-d}$ (where $0 \leq a \leq 1$, $0 \leq b \leq 1$, $a+b \leq 1$, $0 \leq c < 1$, $0 \leq d < 1$, and $c+d < 1$),
    said first buffer layer and said second buffer layer having different bandgap energies and having two-dimensional electron gas density or densities therein not greater than $5 \times 10^{12}$ cm$^{-2}$;
    said first buffer layer having a thickness of not less than 0.5 nm and not greater than 20 nm, and said second buffer layer having a thickness of not less than 0.5 nm and not greater than 20 nm; and
    said semiconductor electron device operates at an operating current of not less than 1 ampere or an operating voltage of not less than 100 volts.

5. The semiconductor electron device according to claim 4, wherein said buffer layer structure includes a plurality of said first buffer layers and a plurality of said second buffer layers, which are alternately laid one on another.

6. A nitride-based compound semiconductor electron device comprising:
    a substrate; and
    a semiconductor layer structure including a buffer layer structure, a channel layer and a donor layer, that are consecutively formed in this order on said substrate, wherein:
    said buffer layer structure includes: at least one first buffer layer comprising as a main component thereof a compound semiconductor expressed by the general formula of $Al_xIn_yGa_{1-x-y}As_uP_vN_{1-u-v}$ (where $0 \leq x \leq 1$, $0 \leq y \leq 1$, $x+y \leq 1$, $0 \leq u < 1$, $0 \leq v < 1$, and $u+v < 1$); and at least one second buffer layer comprising as a main component thereof a compound semiconductor expressed by the general formula of $Al_aIn_bGa_{1-a-b}As_cP_dN_{1-c-d}$ (where $0 \leq a \leq 1$, $0 \leq b \leq 1$, $a+b \leq 1$, $0 \leq c < 1$, $0 \leq d < 1$, and $c+d < 1$),
    said first buffer layer and said second buffer layer have different bandgap energies, and have two-dimensional electron gas density or densities therein not greater than $5 \times 10^{12}$ cm$^{-2}$;
    said first buffer layers has a thickness of not less than 0.5 nm and not greater than 20 nm, and each of said second buffer layers has a thickness of not less than 0.5 nm and not greater than 20 nm;
    wherein said buffer layer structure includes a plurality of said first buffer layers and a plurality of second buffer layers, which are alternately laid one on another; and
    said first and second buffer layers comprise one of Mg, Be, Zn, and C in an amount of not less than $1 \times 10^{16}$ cm$^{-3}$ and not greater than $1 \times 10^{21}$ cm$^{-3}$.

7. The semiconductor electron device according to claim 5, wherein said first buffer layer has an Al composition of x not less than 0.5.

8. A nitride-based compound semiconductor electron device comprising:
- a substrate; and
- a semiconductor layer structure including a buffer layer structure, a channel layer and a donor layer, that are consecutively formed in this order on said substrate, wherein:
- said buffer layer structure includes: at least one first buffer layer comprising as a main component thereof a compound semiconductor expressed by the general formula of $Al_xIn_yGa_{1-x-y}As_uP_vN_{1-u-v}$ (where $0 \leq x \leq 1$, $0 \leq y \leq 1$, $x+y \leq 1$, $0 \leq u < 1$, $0 \leq v < 1$, and $u+v < 1$); and at least one second buffer layer comprising as a main component thereof a compound semiconductor expressed by the general formula of $Al_aIn_bGa_{1-a-b}As_cP_dN_{1-c-d}$ (where $0 \leq a \leq 1$, $0 \leq b \leq 1$, $a+b \leq 1$, $0 \leq c < 1$, $0 \leq d < 1$, and $c+d < 1$), said first buffer layer and said second buffer layer have different bandgap energies, and have two-dimensional electron gas density or densities therein not greater than $5 \times 10^{12}$ cm$^{-2}$;
- said buffer layer structure includes a plurality of said first buffer layers and a plurality of said second buffer layers, which are alternately laid one on another; and
- said semiconductor electron device operates at an operating current of not less than 1 ampere or an operating voltage of not less than 100 volts.

9. The semiconductor electron device according to claim 8 wherein said first buffer layer has an Al composition of x not less than 0.5.

* * * * *